United States Patent [19]

Akachi et al.

[11] Patent Number: 4,939,459

[45] Date of Patent: Jul. 3, 1990

[54] HIGH SENSITIVITY MAGNETIC SENSOR

[75] Inventors: Yoshiaki Akachi, Yachiyo; Mutumi Kinosita, Narita, both of Japan

[73] Assignee: TDK Corporation, Tokyo, Japan

[21] Appl. No.: 287,153

[22] Filed: Dec. 21, 1988

[30] Foreign Application Priority Data

| Dec. 21, 1987 | [JP] | Japan | 63-323201 |
| Aug. 29, 1988 | [JP] | Japan | 63-214464 |
| Aug. 29, 1988 | [JP] | Japan | 63-214465 |

[51] Int. Cl.$^5$ .......................................... G01R 33/02
[52] U.S. Cl. ..................... 324/247; 324/258; 324/257
[58] Field of Search ............... 324/244, 247, 253–255, 324/260, 249, 256–259

[56] References Cited

U.S. PATENT DOCUMENTS

| 2,446,939 | 8/1948 | MacCallum | 324/253 |
| 2,548,843 | 3/1951 | Frosch | 324/255 |
| 2,856,581 | 10/1958 | Alldredge | 324/253 |
| 2,916,696 | 12/1959 | Schonstedt | 324/254 |
| 3,426,269 | 2/1969 | Schonstedt | 324/254 |
| 3,439,264 | 4/1969 | Schonstedt | 324/254 X |
| 3,718,872 | 2/1973 | Takeuchi et al. | 324/253 X |
| 4,714,880 | 12/1987 | Charmet . | |

FOREIGN PATENT DOCUMENTS 2525143 12/1975 Fed. Rep. of Germany .
59-104573 6/1984 Japan .
2195452 4/1988 United Kingdom .

OTHER PUBLICATIONS

Anwendugen der Magnetfeld-sensoren KMZ 10, nach Unterlagen von A. Petersen bearbeitet von J. Koch, Nov. 1986, pp. 1–17.
"Magnetic Direction Sensor", Mitsubishi Denki Giho, vol. 61, No. 8, 1987, pp. 81(673)–86(678).
SAE Technical Paper Series, "Magnetic Field Sensor and its Application to Automobiles", Society of Automotive Engineers, Inc., 1980 (Feb.), pp. 83–90.
"Development of NAVICOM", Toyota Giho, vol. 34, No. 2, 1984, pp. 193–200.

Primary Examiner—Reinhard J. Eisenzopf
Assistant Examiner—Warren S. Edmonds
Attorney, Agent, or Firm—Oblon, Spivak, McClelland, Maier & Neustadt

[57] ABSTRACT

A magnetic sensor is provided for use in detecting an external magnetic field, typically geomagnetism. Pulse or alternating current is applied across a wire or strip-shaped electrically conductive, magnetic body in its longitudinal direction to create an internal magnetic field in the magnetic body. A pick-up winding is wound around the magnetic body. The sensor detects an electric signal developed in the winding as a result of interaction of the internal and external magnetic fields.

26 Claims, 12 Drawing Sheets

HIGH SENSITIVITY MAGNETIC SENSOR

BACKGROUND OF THE INVENTION

This invention relates to magnetic sensors, and more particularly, to magnetic sensors capable of detecting the presence, magnitude, and direction of an external magnetic field and useful as azimuth, position, inclination, electric current and other sensors.

Magnetic sensors are used to detect the presence or absence, magnitude, and direction of an external magnetic field. Most magnetic sensors are of the design that a magnetic core has an exciting winding and a pick-up winding wound thereon. Referring to FIG. 19, there is illustrated a prior art conventional magnetic sensor comprising a magnetic core 1 and exciting and detecting windings 2 and 3 wound thereon. In the illustrated arrangement, the core 1 typically in the form of a rod is placed such that its axis is in alignment with the direction of an external magnetic field H0. Alternating current is supplied through the exciting winding 2 from a power supply 4 to produce an internal magnetic field Hi in the magnetic core 1 in an axial direction thereof. In response to the thus produced internal magnetic field Hi, an output voltage in the form of a wave fundamental or harmonic to the input appears at an output terminal 5 of the detecting winding 3. Since the external magnetic field H0 acts to bias the internal magnetic field Hi, the output voltage varies with the magnitude of the external magnetic field H0. In this way, the illustrated arrangement detects the magnitude of the external magnetic field H0. This type of magnetic sensor may be used as an electric current sensor, for example, in which a variation in magnitude of an external magnetic field H0 which varies with the magnitude of an electric current is detected as a variation of output voltage.

FIG. 20 illustrates another application of the magnetic sensor of FIG. 19. The magnetic sensor and means for producing an external magnetic field are placed such that the relative position (depicted by an angle θ) of the magnetic core 1 and the external magnetic field H0 are variable. In response to the internal magnetic field Hi induced in the magnetic core 1, a variation of a component of the external magnetic field H0 in the axial direction of the core 1, H0 · cos θ, appears as a variation of the output voltage. These magnetic sensors can be used alone or as a combination of two or more as an azimuth or inclination sensor.

The principle of operation of the magnetic sensors shown in FIGS. 19 and 20 is briefly described with reference to FIG. 21. In either case, the direction of a magnetic flux of an external magnetic field H0 or a component thereof is in parallel with the direction of an internal magnetic field Hi as shown in FIG. 21A. The strength of the resultant magnetic field reaches maximum when the external and internal magnetic fields H0 and Hi have the same direction as shown in FIG. 21B, but minimum when the external and internal magnetic fields H0 and Hi have opposite directions as shown in FIG. 21C. Such a variation is detected as a variation of output voltage.

The magnetic sensors shown in FIGS. 19 and 20 require two windings, exciting and detecting windings 2 and 3, resulting in a rather complicated structure.

Another prior art well-known magnetic sensor is a sensor based on a Hall element, which suffers from poor sensitivity.

SUMMARY OF THE INVENTION

A primary object of the present invention is to provide a novel magnetic sensor.

Another object of the present invention is to provide a magnetic field sensor capable of detecting geomagnetism which ranges from about 0.3 to about 0.5 Oe or a similar magnetic field without saturation.

Briefly stated, the present invention provides a magnetic sensor for use in the detection of an external magnetic field, comprising
an elongated, electrically conductive, magnetic body,
means for applying pulse or alternating current across the magnetic body in its longitudinal direction to create an internal magnetic field in the magnetic body, and
detecting means associated with the magnetic body for detecting the interaction of the internal and external magnetic fields as an electric signal.

Alternately, an assembly of an elongated electric conductor and an elongated magnetic body disposed adjacent thereto may be used instead of the conductive magnetic body.

Preferably, the detecting means includes a winding wound around the magnetic body so that the detecting means detects an electric signal developed in the winding as a result of interaction of the internal and external magnetic fields.

In one preferred embodiment wherein the present invention is used as a magnetic field sensor capable of detecting geomagnetism which ranges from about 0.3 to about 0.5 Oe or a similar magnetic field, the magnetic body is formed from a substantially magnetostriction-free amorphous cobalt-based alloy and has a length of from about 10 to about 130 mm, preferably from about 10 to about 100 mm, most preferably from about 10 to about 50 mm and/or a cross-sectional area of from about 0.01 to about 0.28 mm$^2$, preferably from about 0.025 to about 0.28 mm$^2$. Within these ranges, the magnetic field sensor provides linearity between the magnetic field strength and the output voltage.

BRIEF DESCRIPTION OF THE DRAWINGS

These and other objects, features, and advantages of the present invention will be better understood from the following description taken in conjunction with the accompanying drawings, in which.

DESCRIPTION OF THE PREFERRED EMBODIMENTS

Figure 1:
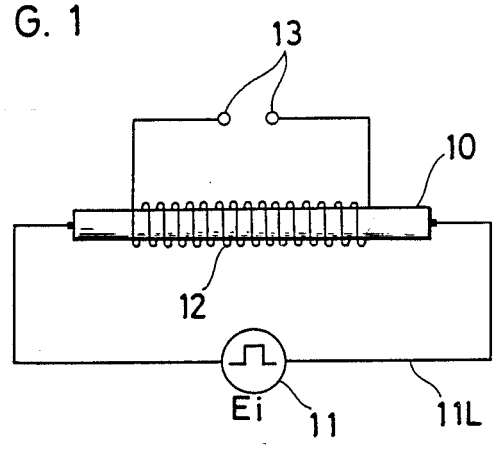
FIG. 1 is a schematic view showing a magnetic sensor according to a first embodiment of the present invention.

Referring to FIG. 1, there is illustrated a magnetic sensor according to a first embodiment of the present invention. The magnetic sensor includes an elongated, electrically conductive, magnetic body 10, means in the form of a power supply 11 for applying pulse or alternating current across the magnetic body 10 in its longitudinal direction, and detecting means including a winding 12 wound around the magnetic body.

More illustratively, the magnetic body 10 is typically of wire or rod shape. It is shown in FIG. 1 as having an axis and opposed ends. The power supply 11 is connected in ohmic contact to the opposite ends of the magnetic body 10 through a pair of leads 11L. The winding 12 is spirally wound around the magnetic body 10 through a suitable insulation and provides output terminals 13 at its ends.

Figure 2:
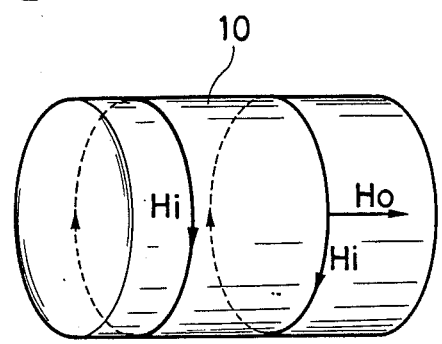
FIG. 2 illustrates the principle of operation of the present invention.

The principle of operation of this magnetic sensor is described with reference to FIG. 2. The actuating means in the form of power supply 11 conducts pulse or alternating current across the magnetic body 10 in its axial direction to create an internal magnetic field Hi in a circumferential direction of the magnetic body 10 or in the direction of its spontaneous magnetization. Provided that the magnetic sensor is placed in an external magnetic field H0, the external magnetic field H0 interacts with the internal magnetic field Hi. Then an electric signal E0 is induced in the winding 12 as a result of interaction of the external and internal magnetic fields. The detecting means detects the electric signal E0 across the output terminals 13.

Figure 3:
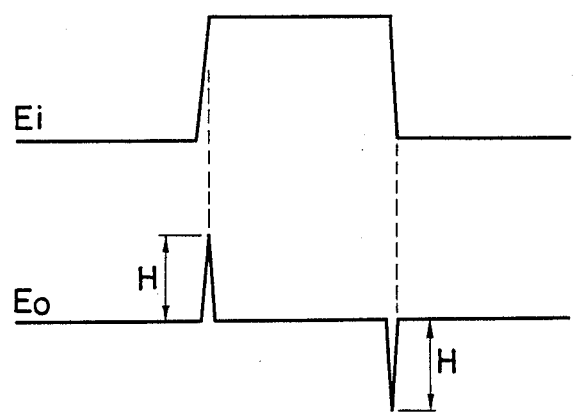
FIG. 3 is a waveform diagram showing input and output voltages in the first embodiment.

FIG. 3 shows waveforms of input and output voltages. The power supply 11 generates a pulse voltage Ei to conduct a pulse current across the magnetic body 10. Correspondingly, an output voltage Eo develops at the output terminals 13 of the pick-up winding 12, provided that the external magnetic field H0 has a different direction from the internal magnetic field Hi. An output voltage E0 having a peak value or pulse height H appears at the time of a rise or fall of the pulse current Ei. Insofar as the external magnetic field H0 has an intensity below a certain limit, the higher the intensity of the external magnetic field H0 and the smaller the angle between the direction of he external magnetic field H0 and the axis of the magnetic body 10, the higher becomes the peak value H.

The magnetic body used herein may be made of any desired magnetic material insofar as it is magnetically soft and electrically conductive. Preferably, the magnetic materials have a high magnetic permeability and a high saturation magnetic flux density. Preferably, they are substantially free from magnetostriction. Typical examples are amorphous alloys and permalloys.

Examples of the amorphous alloys include alloys containing at least one transition metal selected from Fe, Co, and Ni and at least one vitrifying element selected from Si, B, P, C, Al, Ge, Zr, Hf, Ti, Y, Nb, and Ta. The content of vitrifying element is preferably about 5 to 30 atom %. Inclusion of an analogous transition metal is contemplated. Preferred among others are cobalt base amorphous alloys free from magnetostriction. Most preferred Co base amorphous alloys have a composition comprising about 4–6 at % of Fe, about 20–30 at % of Si and B, and optionally up to about 10 at % of Cr, Ti, Nb, Mn, Ni, Ru, Rh, Pt, Os, Nb, Hf, Ta or W, the balance being cobalt.

Also preferred are amorphous alloys containing Co and about 5–30 at % of Zr, Hf, Ti, Nb or Ta. Part of cobalt may be replaced by Fe, Ni or Mn. Inclusion of an additive element such as Si, B, V, Cr, Mo, and W is contemplated as well as inclusion of another transition metal.

Also useful are microcrystalline alloys containing about 10–30 at % of a vitrifying element as defined above, especially Si and B, about 0.5–3 at % of Cu, and about 1–5 at % of Nb, the balance being Fe. Another transition metal may be included in these alloys.

Examples of the permalloy include alloys consisting of 35–80% Ni and the balance of Fe, optionally containing an additive element such as Mo, Cu, and Cr.

Ferrite may be used at the magnetic body through a careful preparation although it is less desirable.

The conductivity of the magnetic body is not critical in the practice of the present invention. The only requirement is that the magnetic body produces a sufficient internal magnetic field to be detected upon actuation with electricity.

The shape of the magnetic body is not critical in the practice of the present invention as long as it is elongated in one direction. Preferably, the magnetic body is in the form of a wire, rod or strip. The wire or rod may be of a circular, rectangular or any other cross section. A bundle of wires is included as well as a stack of strips. The magnetic body may also be formed as a film or the like.

In general, the dimensions of the magnetic body is not critical in the practice of the present invention. In the application as magnetic field sensors for detecting a magnetic field as given by geomagnetism which ranges from about 0.3 to about 0.5 Oe, it is preferred that the magnetic body has a length of about 10 to about 130 mm and a cross-sectional area of about 0.01 to about 0.3 mm$^2$.

Leads from a power source may be connected to the opposite ends of the magnetic body as by press bonding, welding, soldering or any other conventional technique.

The electricity to be applied to the magnetic body is alternating or pulse current.

The detecting means is preferably a combination of a winding wound around the magnetic body and a detecting/processing circuit electrically connected thereto. Any desired detecting means may be used as long as it can detect a change of the induced internal magnetic field under the influence of an external magnetic field. A winding or coil wound around the magnetic body is most preferred because the resulting assembly is compact and rigid. Since the commercial technique for coil winding in a continuous, precise and consistent manner is established, closely wound coils can be produced in a commercial scale.

Although a separate detecting coil may be disposed in proximity to the magnetic body, alignment is very difficult.

The magnetic field which can be sensed by the sensor of the invention generally ranges from about 50 Oe to about 1/100 Oe, although a higher or lower magnetic field may also be detectable. The sensor has a high resolving power.

EXAMPLE 1

A wire of amorphous magnetostriction-free cobalt-base magnetic material (Co—Fe—Si—B) having a diameter of 125 μm and a length of 65 mm as the magnetic body 10 at its opposite ends was connected across a power supply. An insulated conductor was spirally wound 200 turns around the wire as the detecting winding 12. The wire was placed on a non-magnetic base such that the axis of the wire extends parallel to a horizontal component of geomagnetism. A pulse current having an amplitude of 2 volts, a duty factor of 50% and a repetition cycle of 10 μsec. was applied across the wire. Under the condition, the wire or magnetic body 10 was rotated clockwise in a horizontal plane. Then the output voltage across the terminal 13 of the winding varies.

Figure 4:
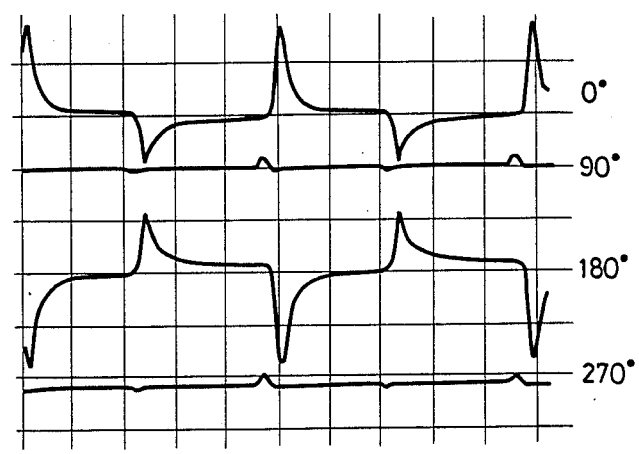
FIG. 4 is a diagram showing output voltage waveforms appearing at different rotation angles in the first embodiment.

FIG. 4 illustrates oscilloscopic curves of output voltage obtained when the angle between the axis of the magnetic wire and the horizontal component of geomagnetism was 0°, 90°, 180°, and 270°. It is observed that the output voltage, more exactly its peak value, was maximum, but of opposite polarity, at the angles of 0° and 180°, that is, when the axis of the magnetic wire is in parallel with the horizontal component of geomagnetism. The output voltage was minimum at the angles of 90° and 270°, that is, when the axis of the magnetic wire is at right angles to the horizontal component of geomagnetism.

Figure 5:
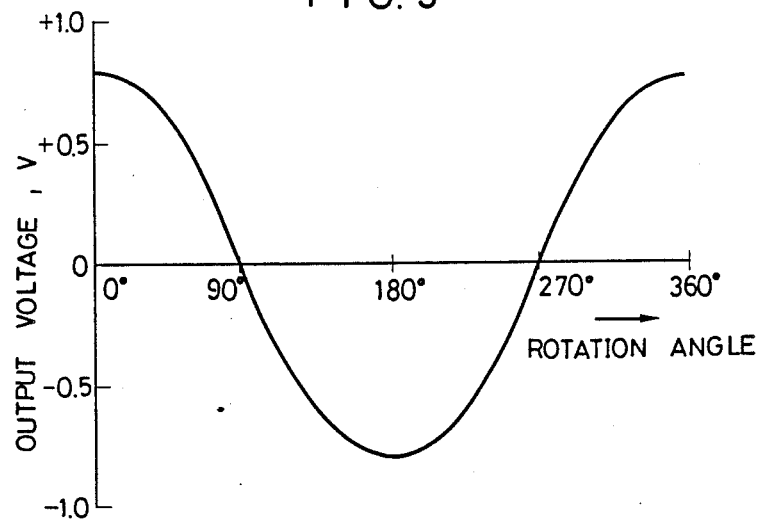
FIG. 5 is a diagram showing the output voltage as a function of rotation angle in the first embodiment.

FIG. 5 shows the output voltage as a function of a rotation angle of the magnetic wire. It is to be noted that the rotation angle is the angle between the axis of the magnetic wire and the horizontal component of geomagnetism, and the output voltage is the peak value of an output voltage which appears at the time of a rise of an applied rectangular voltage pulse. It is seen that the output voltage varies as a cosine curve with the angle of rotation.

Based on the relationship between the rotation angle of the magnetic wire and the output voltage, this magnetic sensor may be used as an azimuth sensor although it alone cannot detect any tilt to either east or west. It may also be used as an inclinometer for detecting the inclination of the magnetic wire with respect to the direction of a magnetic field produced by a magnet, as a current sensor by utilizing the feature that the output voltage is proportional to the strength of an external magnetic field, and as a position or rotation sensor by mounting the magnetic wire and a magnet to a rotor and a stator or vice verse so that an output may develop when the magnetic wire is just opposed to the magnet.

Figure 6:
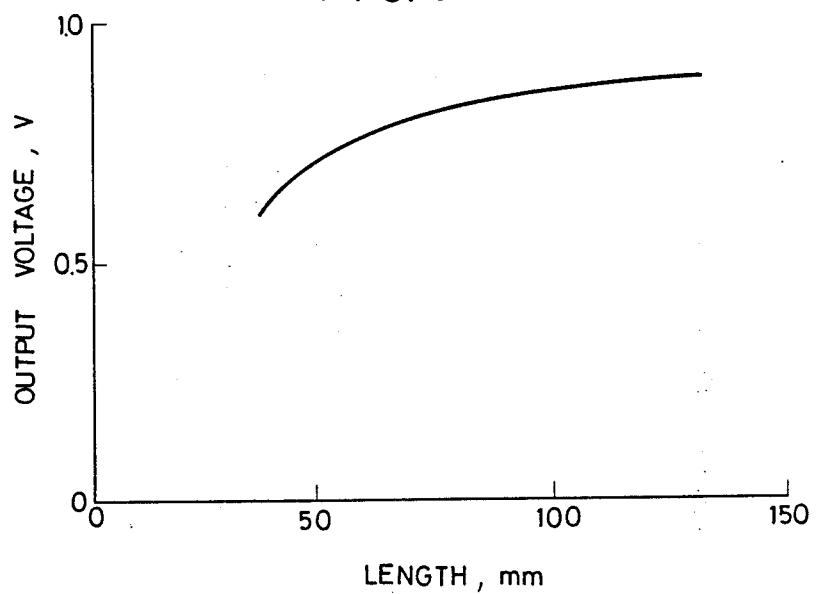
FIG. 6 is a diagram showing the output voltage as a function of magnetic body length in the first embodiment.

A series of runs were carried out using the magnetic body 10 in the form of an amorphous wire of the same material and diameter as above except that the length of the wire was varied over the range of from 40 mm to 130 mm. The detecting winding was wound 200 turns at the same pitch. A pulse constant current having an amplitude of 2 volts, a duty factor of 50% and a repetition cycle of 10 μsec. was applied across the wire. The axis of the magnetic wire was aligned with the horizontal component of geomagnetism. A change of output voltage was determined with a varying length of magnetic wire. The results are shown in FIG. 6. It is seen that the output voltage gradually increases with an increase in magnetic wire length.

Figure 7:
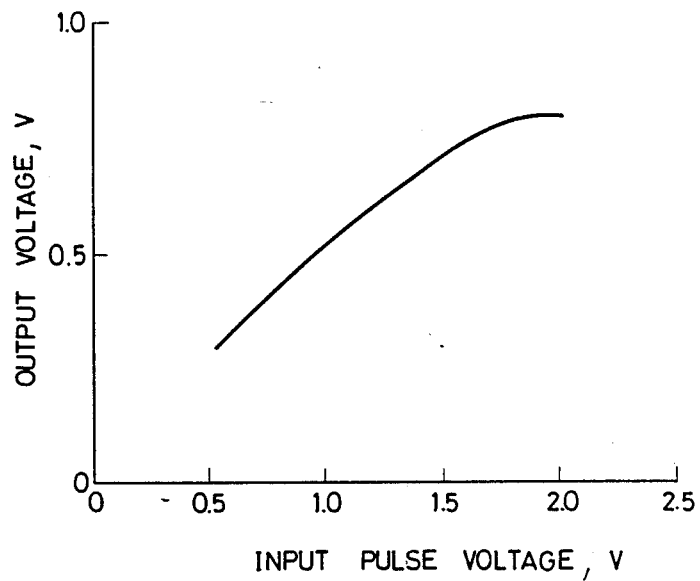
FIG. 7 is a diagram showing the output voltage as a function of input pulse voltage in the first embodiment.

Another series of runs were carried out using the magnetic body 10 in the form of an amorphous wire of the same material and diameter as above and a length of 65 mm. This magnetic wire had a direct current resistance of 12 Ω. The detecting winding was wound 200 turns at the same pitch. An input voltage having a duty factor of 50% and a repetition cycle of 10 μsec. was applied across the wire while its amplitude was varied over the range of from 0.5 volts to 2.0 volts. The axis of the magnetic wire was aligned with the horizontal component of geomagnetism. A change of output voltage was determined with a variation of the input voltage. The results are shown in FIG. 7. It is seen that the output voltage increases in proportion to the input voltage or current until the voltage approaches near 2 V.

Figure 8:
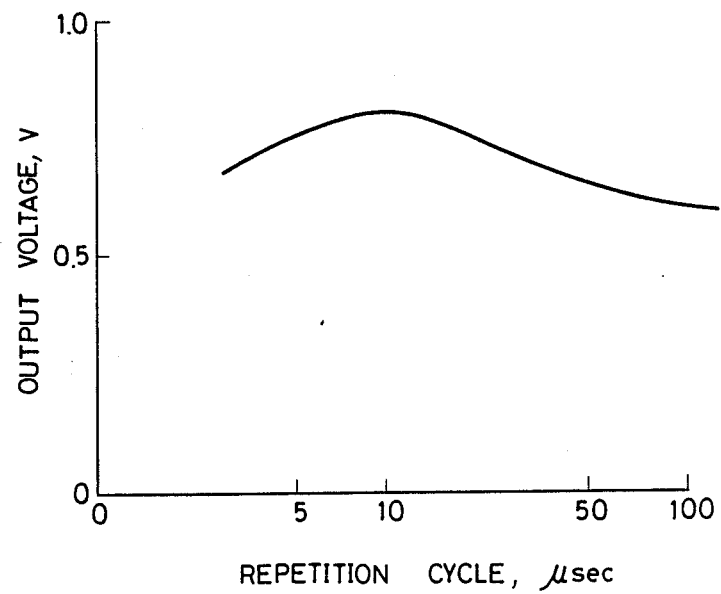
FIG. 8 is a diagram showing the output voltage function of repetition cycle in the first embodiment.

Under the same conditions as the test conditions for FIG. 7, the output voltage was measured while the amplitude of the input voltage was set to 2 V, but its repetition cycle was varied over the range of from 4 μsec. to 100 μsec. The output voltage is plotted in FIG. 8 with the repetition cycle on the abscissa. It is seen that the output voltage does not noticeably change with the repetition cycle.

EXAMPLE 2

A magnetic sensor arrangement was set up as in Example 1 except that a strip was used instead of the wire. The magnetic body 10 used was a thin strip of amorphous magnetostriction-free cobalt-base magnetic material having a width of 1 mm and a thickness of 15 μm. A detecting winding was wound 200 turns about the strip. With the same construction as in Example 1, the magnetic sensor was determined for sensitivity to geomagnetism, finding a similar tendency as observed in the case of a wire.

Figure 9:
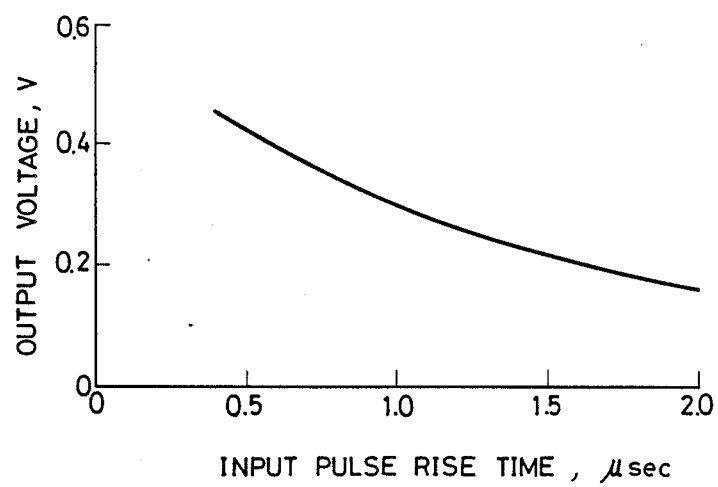
FIG. 9 is a diagram showing the output voltage as a function of input pulse rise time in an embodiment using a band-shaped magnetic body.

Another test was carried out using the magnetic body 10 in the form of an amorphous strip of the same material and diameter as above and a length of 38 mm. This magnetic strip had a direct current resistance of 3 Ω. An input voltage having an amplitude of 0.5 volts, a duty factor of 50% and a repetition cycle of 25 μsec. was applied across the strip while its rise time was varied over the range of from 0.5 μsec. to 2.0 μsec. A change of output voltage was determined with a variation of the input voltage rise time. The results are shown in FIG. 9. A definite tendency was observed that the output voltage increases as the rise time of input pulse is reduced. A rise time of substantially shorter than 0.5 μsec. is undesirable because of inductance effect.

EXAMPLE 3

Figure 10:
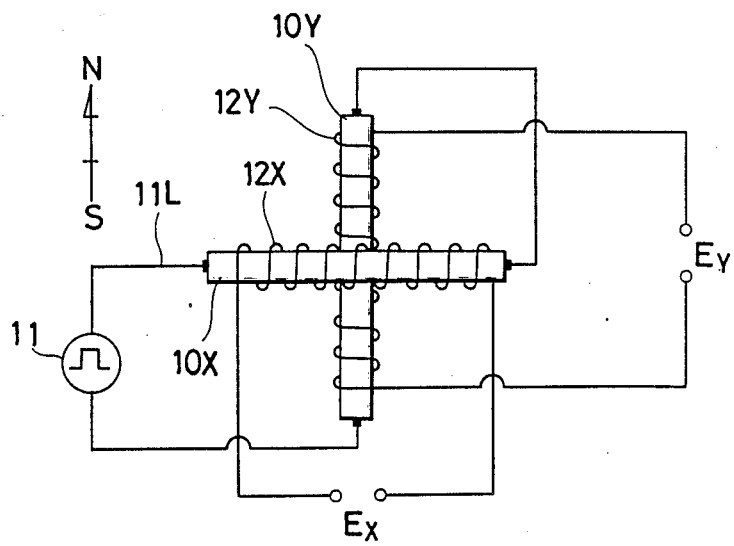
FIG. 10 is a schematic view showing a magnetic sensor arrangement of magnetic bodies disposed in crisscross relationship according to a second embodiment of the present invention.

Two magnetic strips of the same material and dimensions as in Example 2 were used. As illustrated in FIG. 10, magnetic strips 10X and 10Y having windings 12X and 12Y wound 200 turns thereon are crisscrossed. A power supply 11 is connected in series with the strips 10X and 10Y through a lead 11L. That is, one terminal of the power supply 11 is connected to one end of the strip 10X, whose other end is connected to one end of the other strip 10Y, whose other end is connected to the other terminal of the supply 11.

Figure 11:
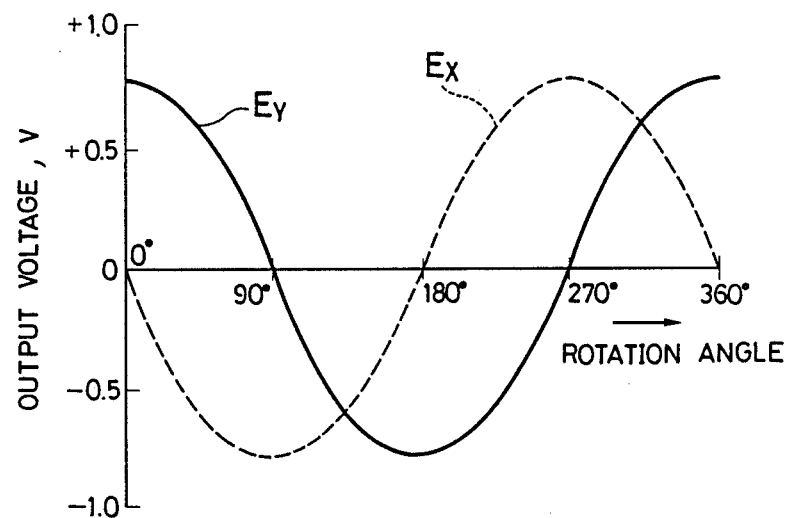
FIG. 11 is a diagram showing the output voltage as a function of rotation angle in the second embodiment.

A pulse voltage having an amplitude of 2 volts, a duty factor of 50% and a repetition cycle of 25 μsec. was applied across the strips. Under the conditions, the strips or magnetic bodies 10X and 10Y were rotated clockwise in a horizontal plane. The output voltages Ex and Ey at the terminals of the windings 12X and 12Y were measured. The results are shown in FIG. 11. FIG. 11 shows how the output voltages Ex and Ey change with a rotation angle, provided that the rotation angle is zero when the crisscross arrangement of magnetic strips 10X and 10Y is set in an azimuth as shown in FIG. 10. As seen from FIG. 10, a particular combination of polarity and peak value of two output voltages Ex and Ey is determined at a certain azimuth. Therefore, the magnetic sensor of crisscross magnetic strips can be used as an azimuth sensor.

Figure 12:
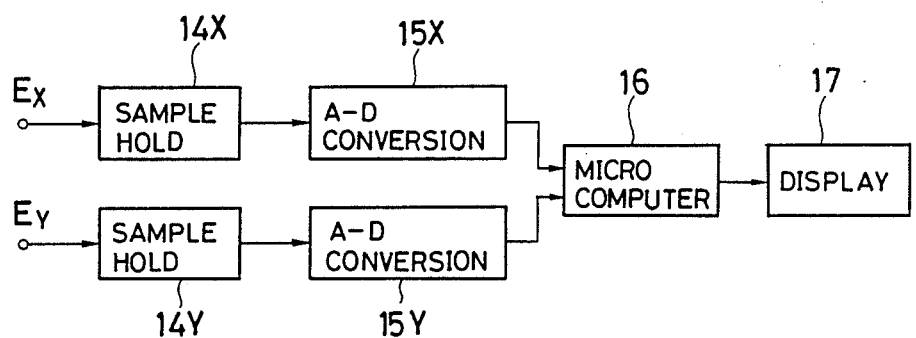
FIG. 12 is a block diagram showing a processing circuit connected to the arrangement of FIG. 10.

FIG. 12 is a block diagram showing an exemplary processing circuit for the magnetic sensor of FIG. 10. The circuit includes a pair of sample-and-hold units 14X and 14Y connected to the terminals of the windings 12X and 12Y for sampling and holding the peak value of output voltages Ex and Ey, respectively, after phase detection. A pair of A-D converters 15X and 15Y are connected to the sample-and-hold units 14X and 14Y for converting the peak voltage values into digital signals. A microcomputer 16 is connected to outputs of the A-D converters for computing an azimuth signal, which is displayed on a display 17 connected to the computer. It will be understood that the circuit for processing output voltages Ex and Ey is not limited to the arrangement of FIG. 12 and any desired processing circuit may be used for the purpose.

Figure 13:
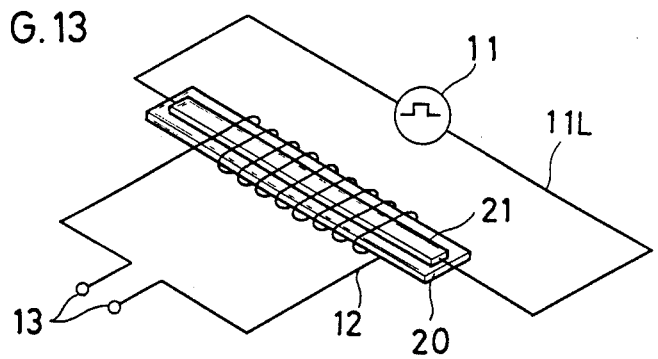
FIG. 13 is a schematic view showing a magnetic sensor arrangement according to a third embodiment of the present invention.

FIG. 13 shows a further embodiment of the present invention. A magnetic film 21 is formed on a substrate 20 of alumina, for example, by a conventional film deposition technique. Leads 11L from a power supply 11 are soldered to the film 21 at opposite ends. An insulated conductor 12 is wound around the substrate 20 and the film 21.

With this arrangement, an external magnetic field can be detected as an electric signal appearing at the terminals 13 of the winding 12 by applying current across the magnetic film 21 from the power supply 11.

In the foregoing embodiments, a pulse voltage of rectangular waveform is applied from the power 11 to the magnetic body 10 although the applied voltage may be of triangular, sine or another waveform.

In an application where it is desired to conduct current of a greater magnitude across the magnetic body, the magnetic body may be of a greater cross section. The cross section of the magnetic body is not limited to circular and rectangular, and any suitable cross section may be used. The number of magnetic bodies is not particularly limited when it is desired to fabricate a sensor assembly from more than one element. A combination of different types of magnetic body is also contemplated.

According to a second aspect of the present invention, the conductive magnetic body is replaced by an assembly of an elongated electric conductor and an elongated magnetic body disposed adjacent thereto. Preferably, the magnetic body is in parallel with and in contact with the conductor. More preferably, the magnetic body is in the form of a cylindrical sheath enclosing a rod-shaped conductor. Conversely, the magnetic body may be a bar or strip which is coated with a layer of conductor material.

The material of which the magnetic body is made may be selected from the same materials as previously described. For the conductor, any well-known conductive material, typically copper may be used.

Figure 14:
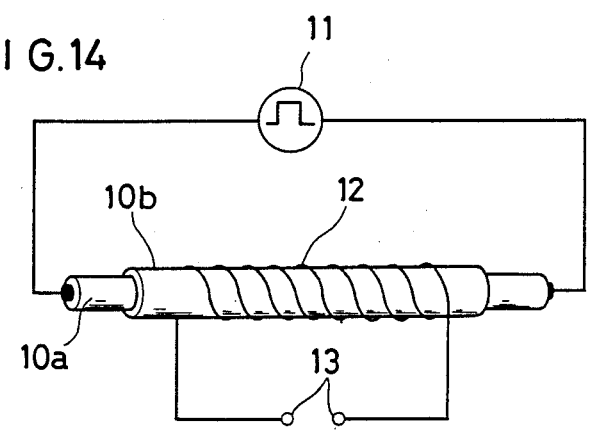
FIG. 14 is a schematic view showing a magnetic sensor arrangement according to a fourth embodiment of the present invention.

FIG. 14 shows one preferred embodiment of this arrangement. The magnetic sensor in this embodiment includes an elongated electric conductor in the form of a rod or wire 10a, and an elongated magnetic body in the form of a cylindrical sleeve 10b enclosing the conductor 10a. The conductor 10a may be made of a metal or similar conductive material, and the magnetic sleeve 10b may be made of a magnetic material such as ferrite and amorphous alloy. This assembly may be fabricated by depositing a magnetic material on a conductor or inserting a conductor into a pre-formed magnetic sleeve.

The remaining actuating and detecting means may be the same power supply 11 and winding 12 as in the preceding embodiments.

Figure 15:
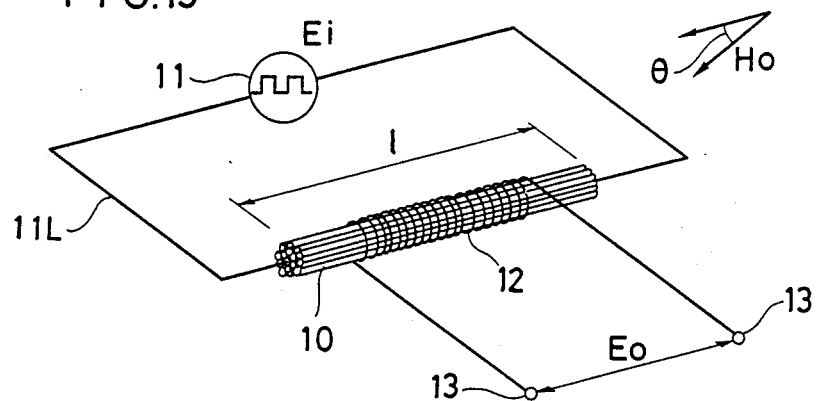
FIG. 15 is a schematic view showing a magnetic sensor arrangement according to a fifth embodiment of the present invention.

FIG. 15 shows a further embodiment of the present invention. This arrangement is substantially the same as that of FIG. 1 except that the magnetic body 10 is a bundle of wire-shaped magnetic conductors. A power supply 11 is connected across the bundle 10. An insulated conductor such as a conventional copper wire is wound about the bundle 10 as a detecting winding 12.

The actuating means or power supply 11 applies a driving pulse voltage Ei across the magnetic bundle 10 to flow current in its axial direction to create an internal magnetic field in a circumferential direction of the magnetic bundle 10. Provided that the magnetic sensor is placed in an external magnetic field H0 having a direction at an angle of $\theta$ with respect to the axis of the bundle 10, the external magnetic field H0 interacts with the internal magnetic field. Then an electric signal E0 which has a peak height corresponding to H0. cos $\theta$ is induced in the winding 12 as a result of interaction of the external and internal magnetic fields. The detecting means detects the electric signal E0 across the output terminals 13.

EXAMPLE 4

Figure 16:
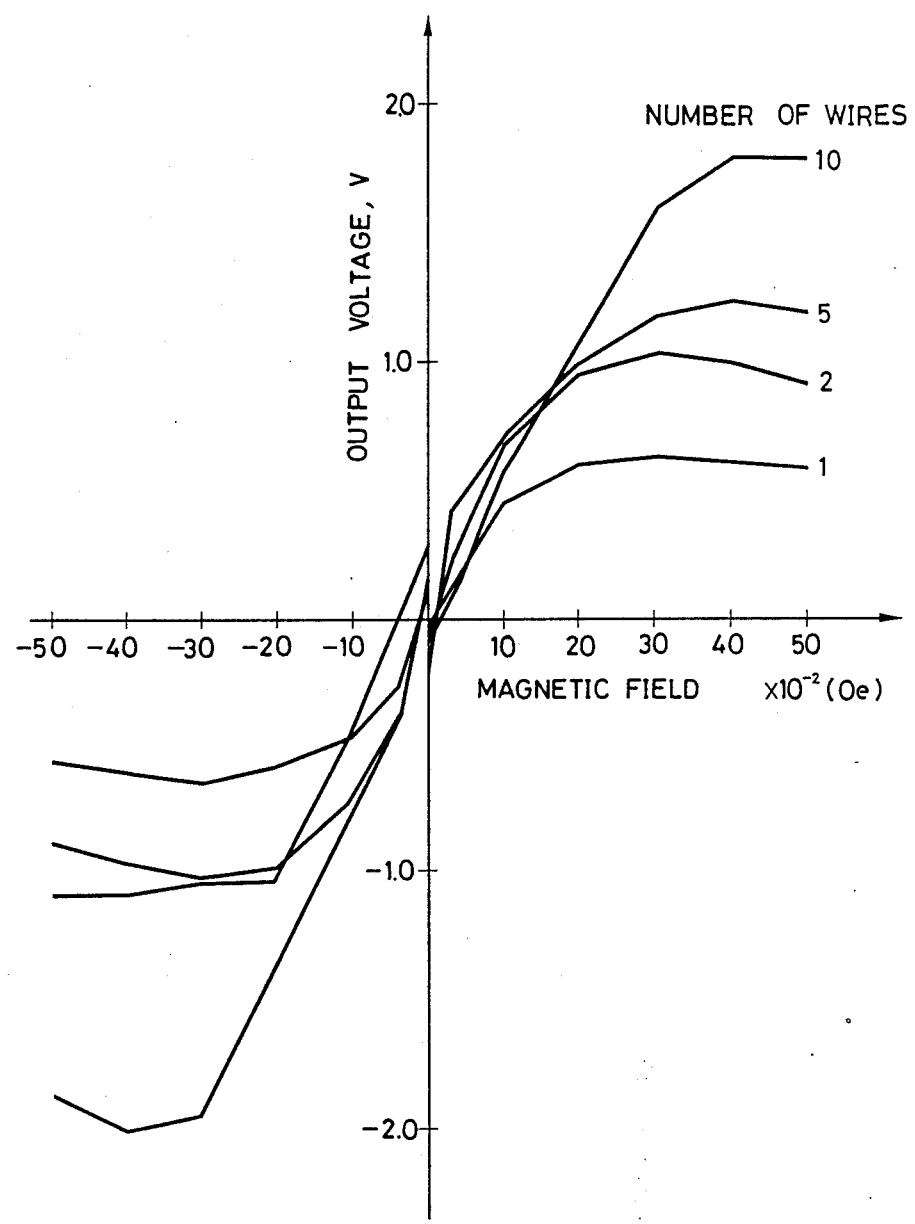
FIG. 16 is a diagram showing the output voltage of the arrangement of FIG. 15 as a function of a magnetic field for different numbers of magnetic wires used in the arrangement.

The arrangement shown in FIG. 15 was constructed. A wire of amorphous cobalt-base alloy was used which had an amplitude magnetic permeability $\mu_a$ of 20,000, a saturation magnetic flux density Bs of 8 kG, a length l of 100 mm, and a cross-sectional area of 0.014 mm². The number of amorphous alloy wires to constitute the magnetic body 10 was changed from 1 to 10 and more. The winding 12 was wound 500 turns about the magnetic body. Pulse current having a peak height of 100 mA was applied to the magnetic body at a repetition frequency of 10 kHz. FIG. 16 shows the output voltage as a function of magnetic field strength for different numbers of wires.

As seen from FIG. 16, under the above-mentioned conditions, linearity is observed between magnetic field strength and output voltage in the magnetic field strength range of 0 to 0.3 Oe when the number of wires is 10 or more (that is, the total cross-sectional area of the magnetic body is 0.14 mm$^2$ or more). Such linearity is independent of the number of turns of the winding 12 and rather independent of the waveform of driving pulse current. However, since the magnitude of output voltage depends on the number of turns of the winding 12 the rise and fall time of the driving pulse current, it is adequate for practical operation to set the rise and fall rate of current (dA/dt) to the order of 120–750 mA/$\mu$sec. and the peak value to the order of 20–150 mA. For the same reason, the length of the magnetic body 10 preferably ranges from about 10 to about 100 mm. Too large a cross-sectional area is rather uneconomical. The upper limit of cross-sectional area is about 0.28 mm$^2$ mainly for the economic reason.

In this example, the magnetic body was 100 mm long. The shorter the magnetic body, the better is improved the linearity. It has been found that in the case of a magnetic body of about 10 mm long, the desired linearity is achieved over the magnetic field strength range of 0–0.3 Oe when the magnetic body has a cross-sectional area of at least about 0.01 mm$^2$, especially at least about 0.025 mm$^2$.

The above embodiment in which a bundle of amorphous alloy wires constitutes the magnetic body is effective in suppressing resistance increase due to skin effect. The arrangement shown in FIG. 1 can be obtained if a single wire having a sufficient cross-sectional area is available. Then with a single wire, there can be established a sensor whose output voltage is not saturated even in detecting a magnetic field of a strength approximate to geomagnetism.

EXAMPLE 5

Figure 17:
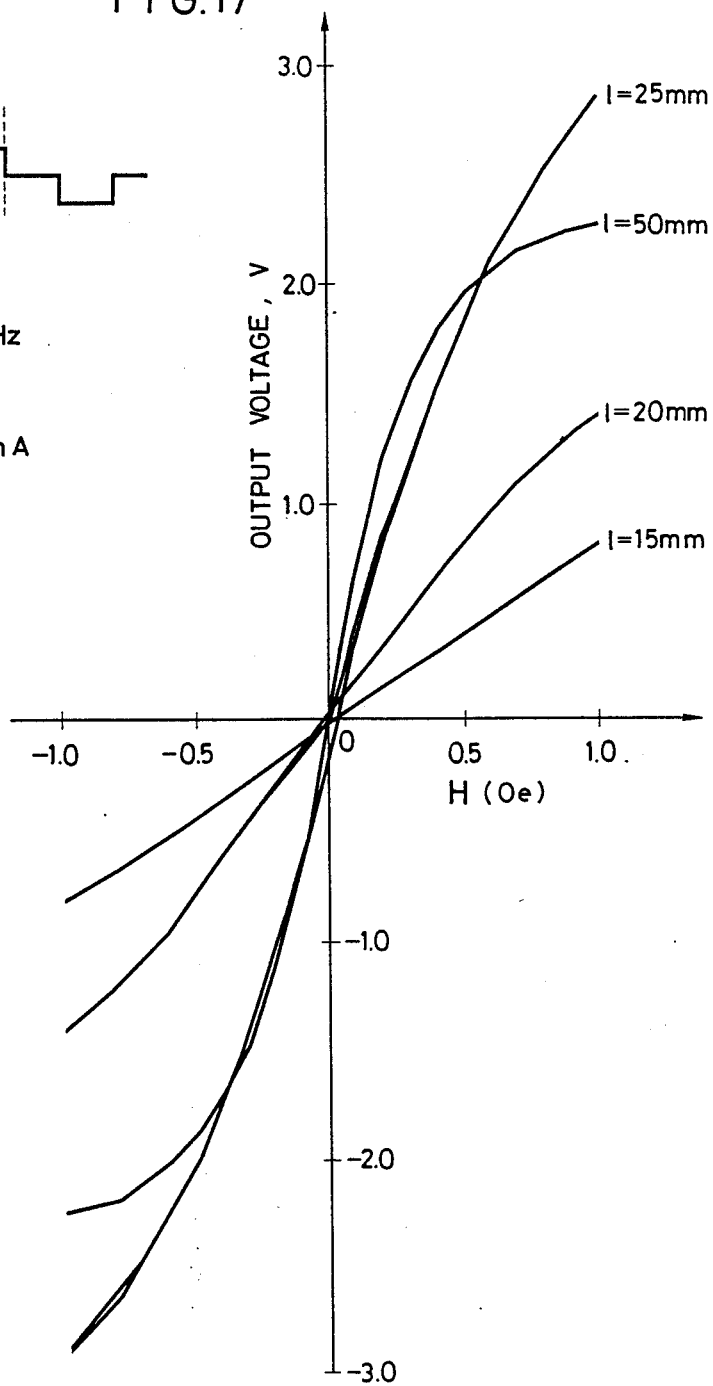
FIG. 17 is a diagram showing the output voltage of the arrangement of FIG. 15 as a function of a magnetic field for different lengths of magnetic wire used in the arrangement.

The arrangement shown in FIG. 1 was constructed. A wire of amorphous cobalt-base alloy was used which had an amplitude magnetic permeability $\mu a$ of 20,000, a saturation magnetic flux density Bs of 8 kG, and a cross-sectional area of 0.014 mm$^2$. The winding 12 was wrapped 500 turns about the wire. Driving pulse current having a peak height of 120 mA was applied to the wire at a repetition frequency of 10 kHz. The length of the amorphous alloy wire to constitute the magnetic body 10 was changed from 15 to 50 mm and more. The output voltage at the rise of a positive driving pulse is plotted in FIG. 17 as a function of magnetic field strength for different wire lengths As seen from FIG. 17, under the above-mentioned conditions, linearity is observed between magnetic field strength and output voltage in the magnetic field strength range of 0 to 0.3 Oe when the length of wire is 50 mm or less. A longer wire does not exhibit satisfactory linearity in this range under the above-mentioned conditions. Such linearity is independent of the number of turns of the winding and rather independent of the waveform of driving pulse current. However, since the magnitude of output voltage depends on the number of turns of the winding and the rise and fall times of the driving pulse current, it is adequate for practical operation to set the rise and fall rate of current (dA/dt) to the order of 120–750 mA/$\mu$sec. and the peak value to the order of 20–150 mA. For the same reason, the cross-sectional area of the magnetic body is preferably at least about 0.01 mm$^2$ although a larger cross section is effective in avoiding saturation of output voltage. The lower limit of length of the magnetic body is about 10 mm for a technical consideration of winding a conductor into a coil thereon.

In this example, the magnetic body consisted of a single wire. The magnetic body may be formed from a bundle of plural wires as in the previous example.

EXAMPLE 6

The arrangement of FIG. 15 was used. The magnetic body used was a pair of wires of the same amorphous Co-base alloy as in Example 5 each having a cross-sectional area of 0.014 mm$^2$ and a length of 25 mm. The winding 12 was wrapped 1,000 turns about the wires. Driving pulse current was applied to the wires at a rise time of 0.13 $\mu$sec. and a repetition frequency of 10 kHz. The peak height of the applied current was set to 40 mA, 80 mA, and 120 mA. The output voltage at the rise of a positive driving pulse is plotted in FIG. 18 as a function of magnetic field strength for different peak heights.

Figure 18:
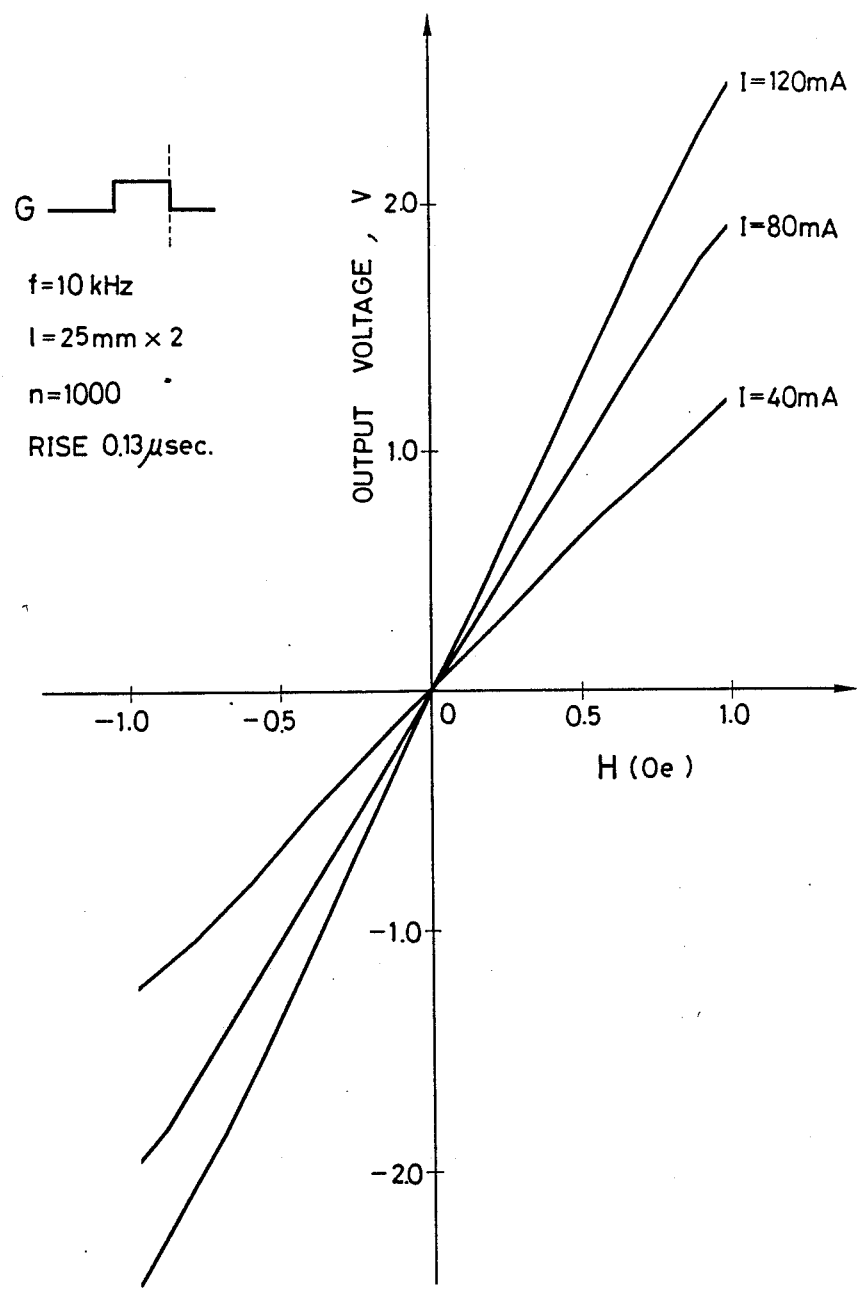
FIG. 18 is a diagram showing the output voltage of the arrangement of FIG. 1 as a function of a magnetic field for different values of current applied across the magnetic body.
Figure 19:
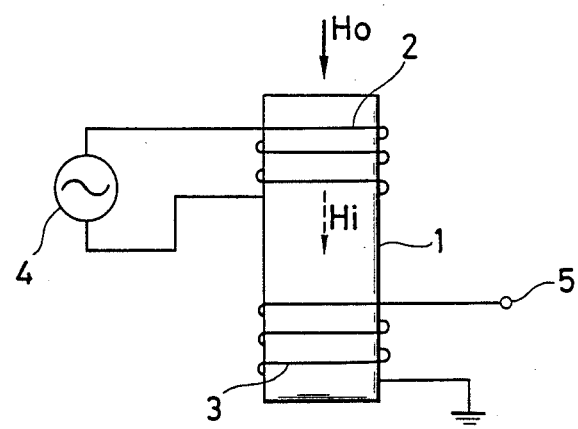
FIGS. 19 and 20 are schematic views of prior art magnetic sensors.
Figure 20:
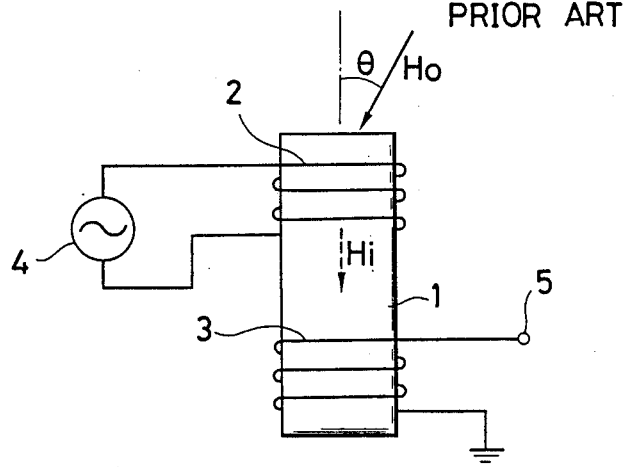
Figure 21A:
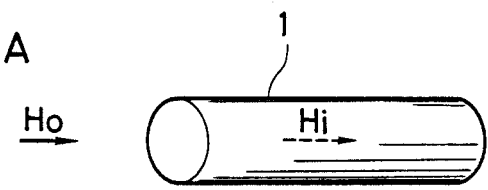
FIGS. 21A-C illustrate the principle of operation of the prior art magnetic sensor.
Figure 21B:
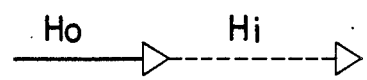
Figure 21C:
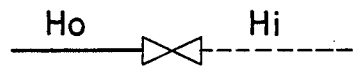

As seen from FIG. 18, with the above-mentioned arrangement and conditions, linearity is observed between magnetic field strength and output voltage in the wide magnetic field strength range of 0 to 1.0 Oe at any current peak heights.

In the foregoing examples, there are some favorable ranges which are outside the overlapped range because the favorable range depends on a particular combination of various parameters including the type, shape, and size of the magnetic body, the driving current, the strength of the magnetic field to be detected, and the like. Even the range where less linearity is expected is acceptable, though less desirable, because such inconvenience may be eliminated by suitable compensating means. With all the above and other experimental data taken into account, it is believed advantageous that the magnetic body is formed from a substantially magnetostriction-free amorphous cobalt-based alloy. Better results are obtained when the magnetic body is a wire or rod having a length of from about 10 to about 130 mm, preferably from about 10 to about 100 mm, most preferably from about 10 to about 50 mm and/or a cross-sectional area of from about 0.01 to about 0.28 mm$^2$, preferably from about 0.025 to about 0.28 mm$^2$.

The magnetic field sensor thus far described may be used alone, but is generally used as a crisscross arrangement of two magnetic bodies as shown FIG. 10. The crisscross arrangement can detect an azimuth from a particular combination of the polarity and peak value of output voltages from X and Y windings.

For the purpose of detecting a magnetic field of a strength as described above, the magnetic field sensor of the invention may be used as a non-contact type DC probe as well as an azimuth sensor.

Since the magnetic sensor of the present invention can detect the presence, magnitude, and direction of an external magnetic field, it is adaptable as an azimuth, position, altitude, inclination, rotation, rotation number, current, and other sensor. The azimuth or rotation sensor constructed from a magnetic field sensor according to the present invention is useful in an automobile navigation system or as a portable compass.

As understood from the foregoing description, the magnetic sensor of the present invention is designed such that pulse or alternating current is directly applied across a magnetic body in its longitudinal direction to create an internal magnetic field in a circumferential direction of the magnetic body, and an external magnetic field is detected as an electric signal which is developed in a winding about the magnetic body as a result of interaction of the internal and external magnetic fields. The direct excitation of the magnetic body eliminates the need for an exciting winding which was required in prior art magnetic sensors using a magnetic core, offering a simplified structure. In the case of an azimuth sensor, for example, the magnetic body may be a wire as thin as 120–130 $\mu$m in diameter, for example. As compared with conventional magnetic sensors having a toroidal magnetic core, the present invention can reduce the weight of magnetic sensor to about 1/10 to about 1/100, achieving weight reduction at the same time as cost reduction. The sensor has sufficient sensitivity and resolution to detect even a very weak magnetic field.

In the embodiment wherein the magnetic body has a length of about 10–130 mm and/or a cross-sectional area of about 0.01–0.28 mm$^2$, the resulting magnetic field sensor can detect a magnetic field having a strength equal or approximate to geomagnetism at a high sensitivity without saturating output voltage. The level of magnetic field at which the output voltage is saturated is increased. In addition, the sensor produces an output voltage which is in linear relationship to the magnetic field strength. Because of linearity, a circuit of simple design can be used for processing the output of the detecting coil. The use of a magnetic body of a reduced size, especially a reduced length results in a compact sensor.

Obviously many modications and variations of the present invention are possible in the light of the above teachings. It is therefore to be understood that within the scope of the appended claims, the invention may be practiced otherwise than as specifically described.

We claim:

1. A magnetic sensor for use in the detection of an external magnetic field, comprising
    an elongated, electrically conductive, magnetic body,
    means for applying pulse or alternating current $i_d$ across the magnetic body in its longitudinal direction to create a non-saturating internal magnetic field in a circumferential direction of the magnetic body such that a pulse output $v_o$ is obtained during the rise or fall time of said current $i_d$, and
    detecting means including a winding wound around the magnetic body for detecting an electric signal developed in the winding as a result of interaction of the internal magnetic field and the external magnetic field.

2. The magnetic sensor of claim 1 wherein the magnetic body is of wire shape.

3. The magnetic sensor of claim 2 wherein the magnetic body is a bundle of magnetic wires.

4. The magnetic sensor of claim 1 wherein the magnetic body is of strip shape.

5. The magnetic sensor of claim 1 wherein the magnetic body is of substantially magnetostriction-free magnetic material.

6. The magnetic sensor of claim 5 wherein the magnetic body is formed from an amorphous cobalt-base alloy.

7. The magnetic sensor of claim 1 wherein the conducting means includes a power supply and a pair of leads extending therefrom to opposite ends of the magnetic body.

8. The magnetic sensor of claim 1 wherein the detecting means includes a detecting circuit electrically connected to output terminals of the winding.

9. The magnetic field sensor of claim 1 for detecting geomagnetism or a magnetic field of similar strength.

10. The magnetic field sensor of claim 9 wherein the magnetic body has a length of about 10 to about 130 mm.

11. The magnetic field sensor of claim 9 wherein the magnetic body has a cross sectional area of about 0.01 to about 0.28 mm$^2$.

12. A magnetic sensor for use in the detection of an external magnetic field, comprising
    an elongated magnetic body,
    an elongated electric conductor disposed adjacent the magnetic body,
    means for applying pulse or alternating current $i_d$ across the conductor in its longitudinal direction to create a non-saturating internal magnetic field in a circumferential direction of the magnetic body such that a pulse output $v_o$ is obtained during the rise or fall time of said current $i_d$, and
    detecting means including a winding wound around the magnetic body for detecting an electric signal developed in the winding as a result of interaction of the internal magnetic field and the external magnetic field.

13. The magnetic sensor of claim 12 wherein the conductor is disposed in parallel with and in contact with the magnetic body.

14. The magnetic sensor of claim 12 wherein the magnetic body is of wire shape.

15. The magnetic sensor of claim 14 wherein the magnetic body is a bundle of magnetic wires.

16. The magnetic sensor of claim 12 wherein the magnetic body is of strip shape.

17. The magnetic sensor of claim 12 wherein the conductor is an elongated rod and the magnetic body is a sheath enclosing the rod.

18. The magnetic sensor of claim 12 wherein the magnetic body is of substantially magnetostriction-free magnetic material.

19. The magnetic sensor of claim 18 wherein the magnetic body is formed from an amorphous cobalt-base alloy.

20. The magnetic sensor of claim 12 wherein the conducting means includes a power supply and a pair of leads extending therefrom to opposite ends of the conductor.

21. The magnetic sensor of claim 12 wherein the detecting means includes a detecting circuit electrically connected to output terminals of the winding.

22. The magnetic field sensor of claim 12 for detecting geomagnetism or a magnetic field of similar strength.

23. The magnetic field sensor of claim 22 wherein the magnetic body has a length of about 10 to about 130 mm.

24. The magnetic field sensor of claim 22 wherein the magnetic body has a cross sectional of about 0.01 to about 0.28 mm$^2$.

25. A magnetic sensor for use in the detection of an external magnetic field, comprising
    an elongated, electrically conductive, magnetic body, means for applying pulse or alternating current $i_d$ across the magnetic body in its longitudinal direction to create a non-saturating internal magnetic field in the magnetic body such that a pulse output $v_o$ is obtained during the rise or fall time of said current $i_d$, and detecting means associated with the magnetic body for detecting the interaction of the internal and external magnetic fields as an electric signal.

26. A magnetic sensor for use in the detection of an external magnetic field, comprising an elongated magnetic body, an elongated electric conductor disposed adjacent to the magnetic body, means for applying pulse or alternating current $i_d$ across the conductor in its axial direction to create a non-saturating internal magnetic field in the magnetic body such that a pulse output $v_o$ is obtained during the rise or fall time of said current $i_d$, and detecting means associated with the magnetic body for detecting the interaction of the internal and external magnetic field as an electric signal.

* * * * *

UNITED STATES PATENT AND TRADEMARK OFFICE
CERTIFICATE OF CORRECTION

PATENT NO.   :   4,939,459
DATED        :   JULY 3, 1990
INVENTOR(S)  :   YOSHIAKI AKACHI ET AL

It is certified that error appears in the above-identified patent and that said Letters Patent is hereby corrected as shown below:

In Column 12, line 64, after "sectional" insert --area--.

Signed and Sealed this

Eleventh Day of February, 1992

Attest:

HARRY F. MANBECK, JR.

*Attesting Officer*   *Commissioner of Patents and Trademarks*